(12) United States Patent
Fujiu et al.

(10) Patent No.: US 8,203,877 B2
(45) Date of Patent: Jun. 19, 2012

(54) NON-VOLATILE SEMICONDUCTOR MEMORY DEVICE CAPABLE OF PREVENTING OVER-PROGRAMMING

(75) Inventors: Masaki Fujiu, Yokohama (JP); Yoshikazu Harada, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/884,594

(22) Filed: Sep. 17, 2010

(65) Prior Publication Data

US 2011/0157973 A1 Jun. 30, 2011

(30) Foreign Application Priority Data

Dec. 25, 2009 (JP) ................................ 2009-295626

(51) Int. Cl.
*G11C 11/34* (2006.01)
(52) U.S. Cl. .......... 365/185.02; 365/185.03; 365/185.19
(58) Field of Classification Search ............... 365/185.02
See application file for complete search history.

(56) References Cited

U.S. PATENT DOCUMENTS

| | | | |
|---|---|---|---|
| 7,057,936 B2 | 6/2006 | Yaegashi et al. | |
| 7,411,819 B2 * | 8/2008 | Takeuchi | 365/185.03 |
| 2008/0205139 A1 * | 8/2008 | Futatsuyama | 365/185.03 |
| 2009/0231924 A1 * | 9/2009 | Nakagawa et al. | 365/185.19 |
| 2011/0007562 A1 * | 1/2011 | Yip | 365/185.03 |

FOREIGN PATENT DOCUMENTS

JP 2004-23044 1/2004

* cited by examiner

*Primary Examiner* — Hoai V Ho
*Assistant Examiner* — Pablo Huerta
(74) *Attorney, Agent, or Firm* — Oblon, Spivak, McClelland, Maier & Neustadt, L.L.P.

(57) ABSTRACT

According to one embodiment, a semiconductor memory device includes a memory cell array, a data memory circuit, a power generation circuit, and a controller. In the memory cell array, a plurality of memory cells which store two-or-more-bit data are arrayed in a matrix. When data is written to all memory cells connected to selected word lines, the controller performs a write operation with a write voltage obtained by adding the step-up voltage to the write voltage until a write count indicating a number of times by which writing is performed reaches a first write count. When the first write count is exceeded, the controller controls whether the step-up voltage is to be added or not, for each write operation.

19 Claims, 9 Drawing Sheets

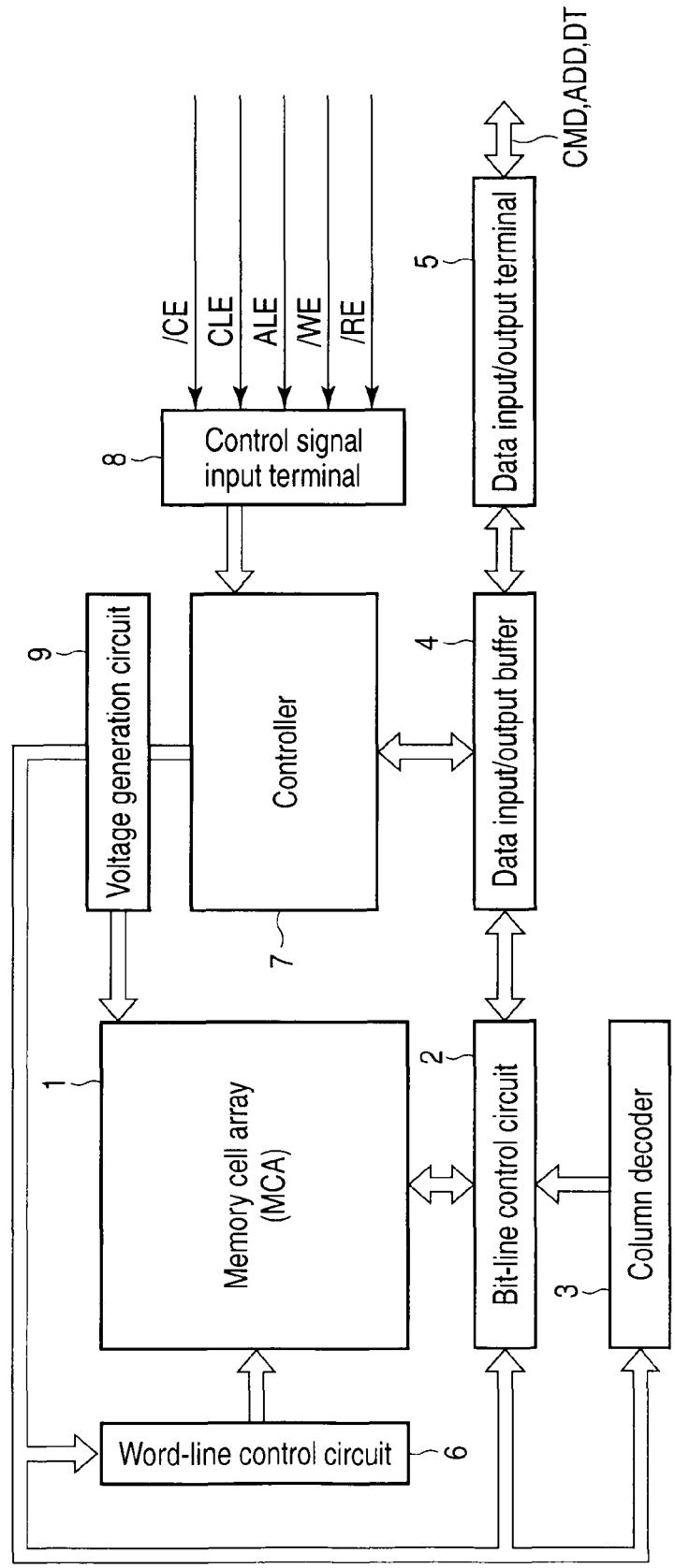
F I G. 1

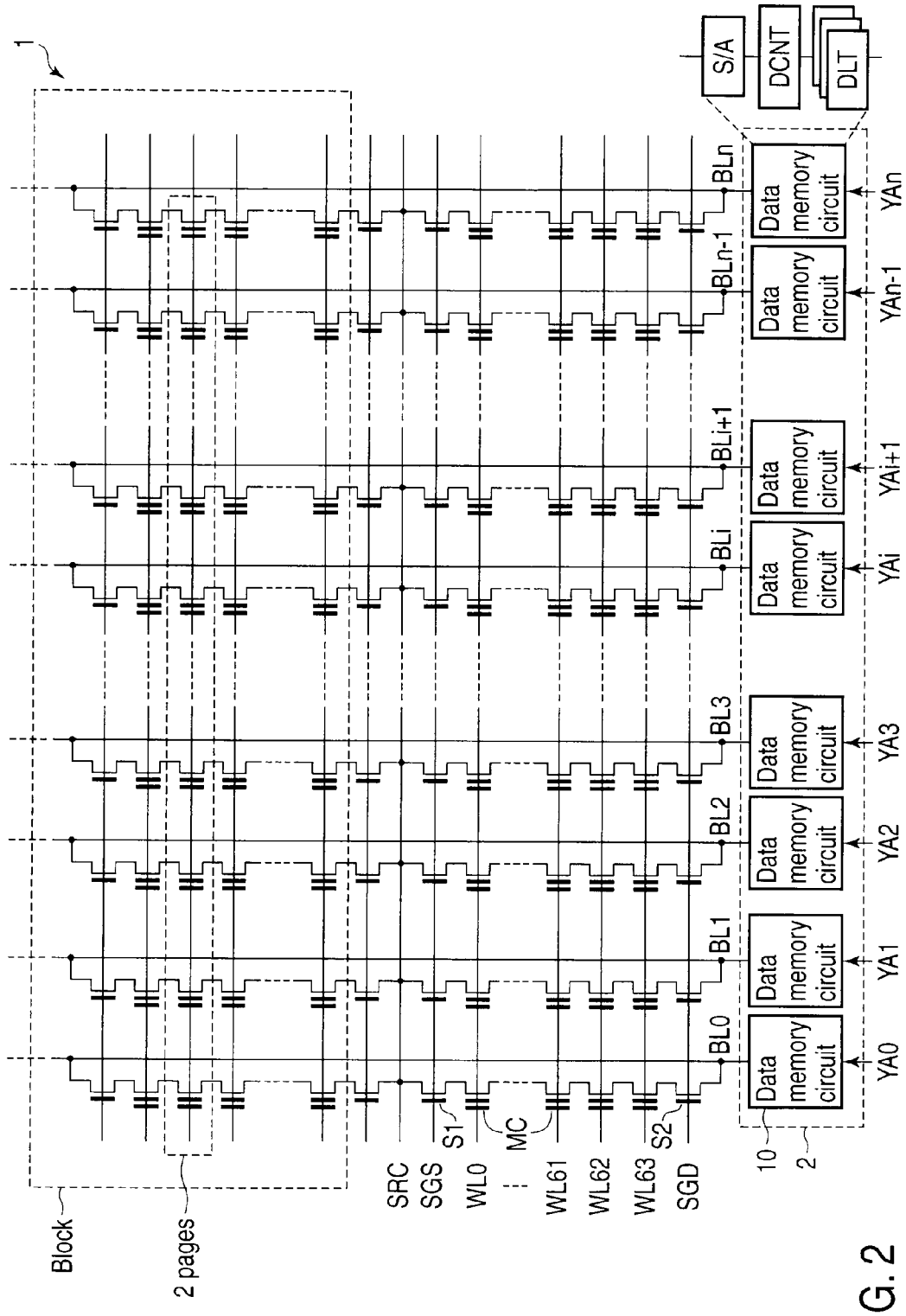
F I G. 2

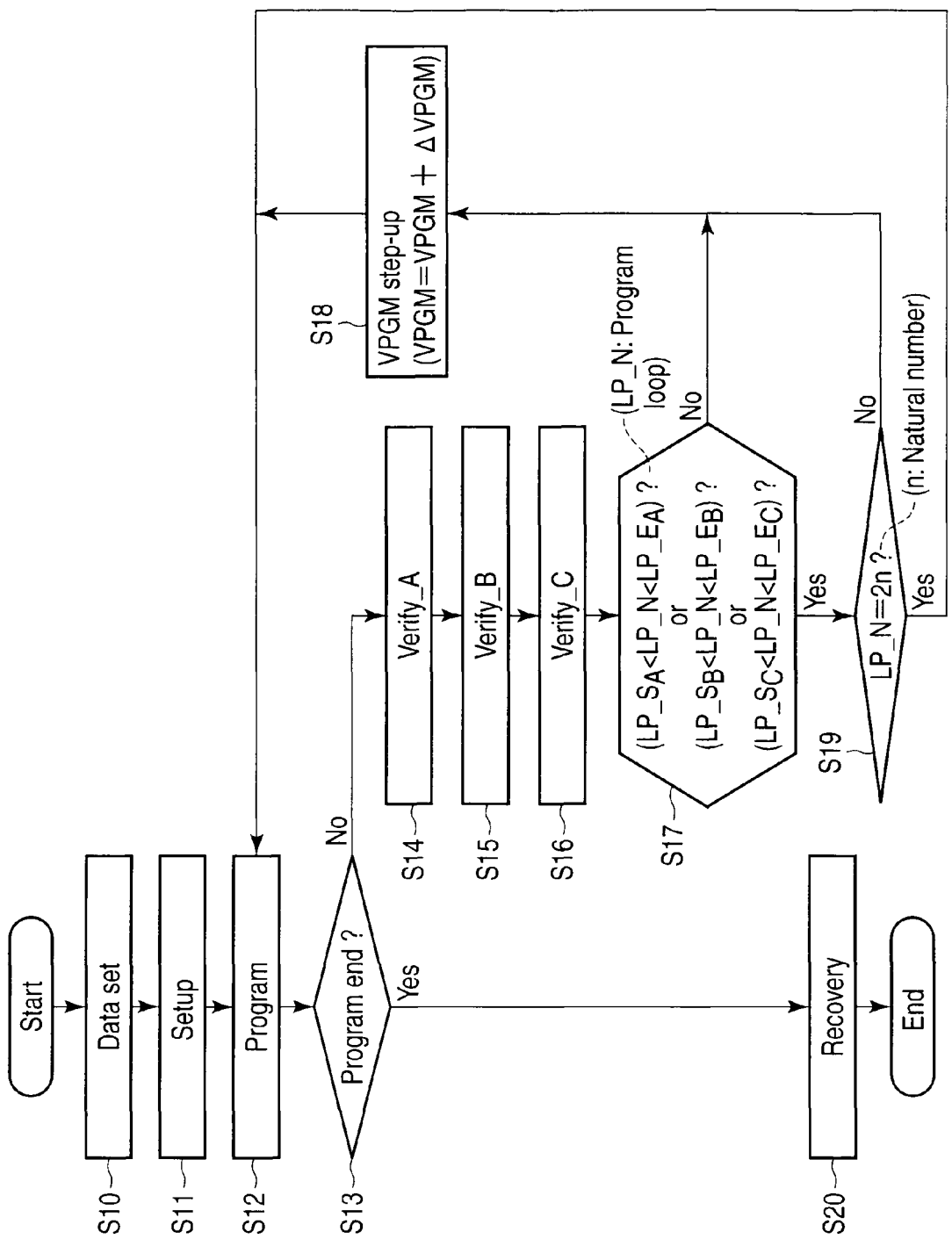
F I G. 4

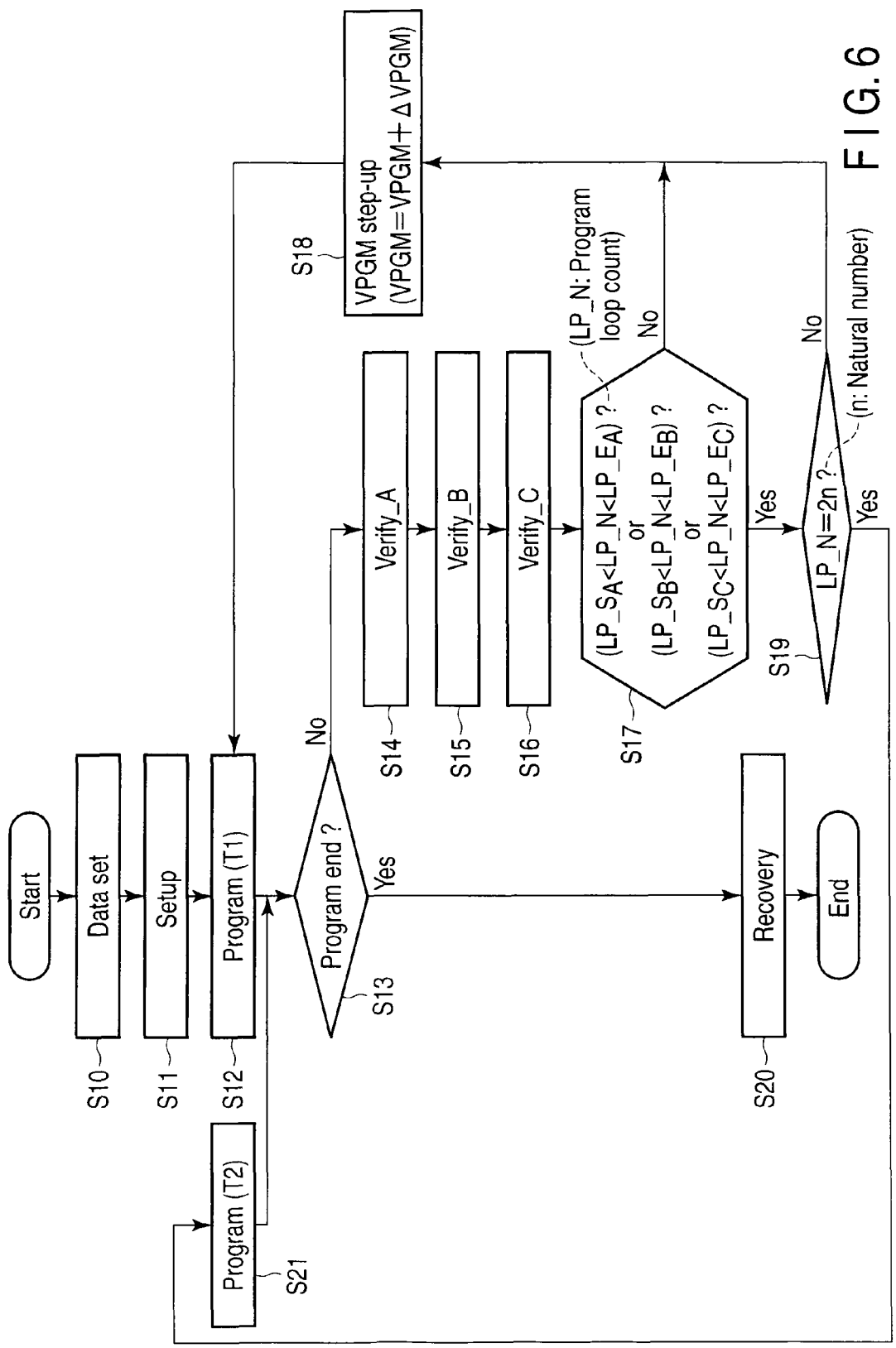
F I G. 6

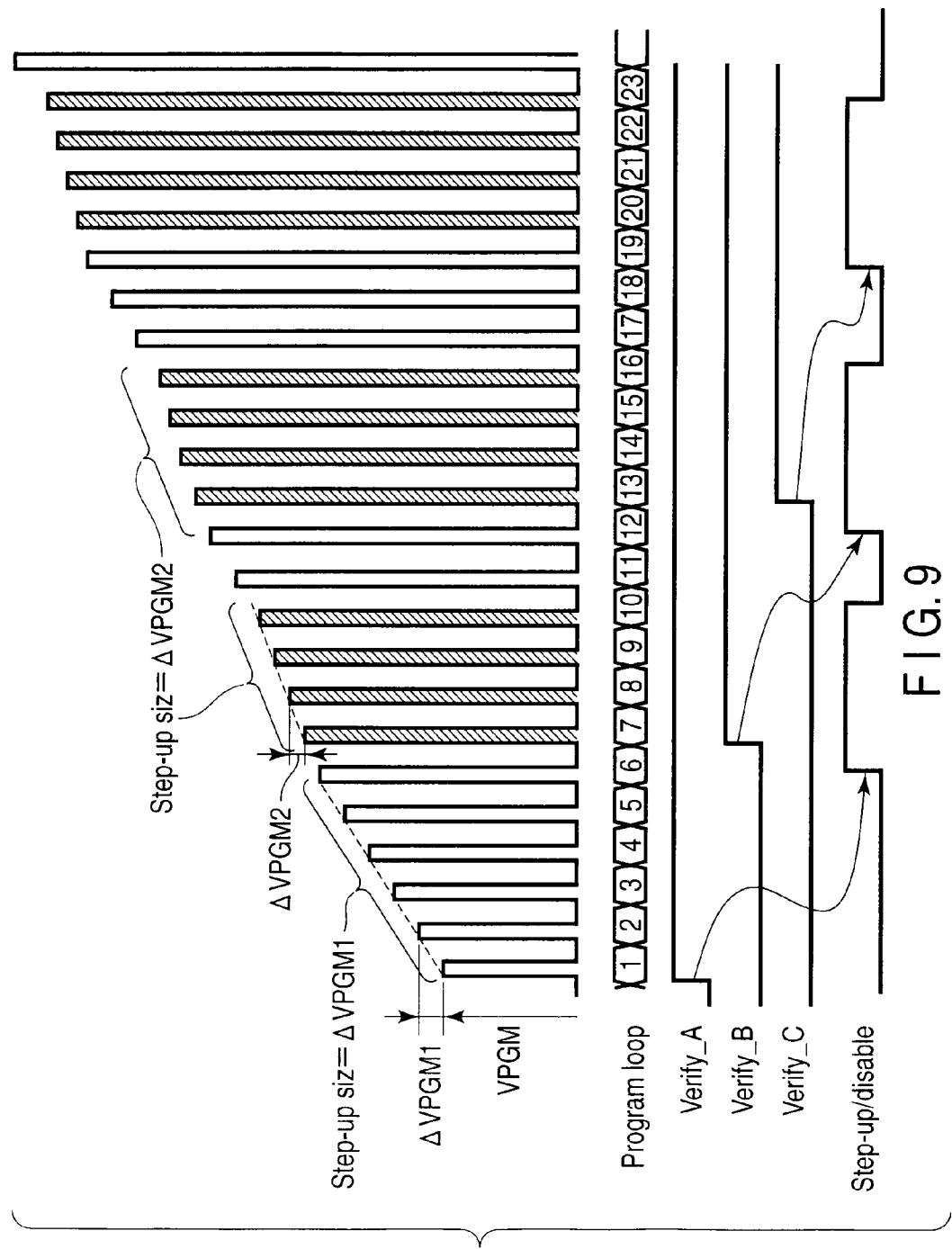

NON-VOLATILE SEMICONDUCTOR MEMORY DEVICE CAPABLE OF PREVENTING OVER-PROGRAMMING

CROSS-REFERENCE TO RELATED APPLICATIONS

This application is based upon and claims the benefit of priority from Japanese Patent Application No. 2009-295626, filed Dec. 25, 2009; the entire contents of which are incorporated herein by reference.

FIELD

Embodiments described herein relate generally to a non-volatile semiconductor memory device, such as a NAND flash memory which stores multi-valued data.

BACKGROUND

In NAND flash memories, data is written to one page which is activated by one word line. Therefore, memory cells existing in one same page need be subjected simultaneously to writing and non-writing at the same time.

Conventional NAND flash memories employ a self-boost operation to perform a non-write operation. In the self-boost operation, an internal power supply potential (VDD) is transferred to channels of NAND strings, to inhibit writing to non-selected memory cells. Thereafter, selected gate transistors are turned off, to put the NAND strings internally into a floating state. Thereafter, selected and non-selected word lines are respectively increased to predetermined potentials, and accordingly, channel potentials of the NAND strings increase due to coupling. Therefore, a potential difference between control gates applied with a writing voltage (also named a program voltage) and channels is decreased to be put in non-writing.

A potential of a floating gate is determined by a potential of a channel, a potential of a control gate, and capacity coupling with adjacent floating gates. For a written cell, the potential of the channel is set to a ground potential VSS by a bit line. For a unwritten cell, the potential of the channel is set to a boost potential, an initial potential of which is the VDD supplied from a bit line as described above.

In a product which employs all bit lines (ABL), all memory cells selected by one word line are simultaneously made accessible. That is, when writing data, all memory cells selected by one word line are simultaneously subjected to writing, on NAND strings connected to even-numbered bit lines and odd-numbered bit lines.

NAND flash memories also perform step-up writing in which a program voltage is gradually stepped up in order to increase writing efficiency and further to accurately control a width of a threshold voltage distribution (see, for example, Jpn. Pat. Appln. KOKAI Publication No. 2004-23044). In the step-up writing, if writing for the first time does not pass, the writing is tried again with a program voltage increased by a constant voltage (corresponding to a step-up voltage). This writing loop is repeated to set a target threshold voltage in memory cells. When the step-up writing is applied to the ABL technique, a problem takes place as follows.

Unwritten cells are maintained in an unwritten state from the begging to the end of a writing loop. In contrast, written cells are set in a written biased state in the beginning of the writing loop. As writing progresses, writing passes in the writing loop for the (N−1)-th time. In this case, in the writing loop for the N-th time, the written cells are set in an unwritten biased state. According to the ABL technique, writing is performed on both odd-numbered and even-numbered bit lines. Therefore, a biased state of a floating gate adjacent to a memory cell (M1) being subjected to writing differs between in writing for the (N−1)-th time and in writing for the N-th time. That is, in writing for the N-th time, a potential of a floating gate of a memory cell of interest differs between when writing to an adjacent memory cell passes and when the writing to the adjacent memory cell does not passed. Specifically, when the writing does not pass, a channel for the adjacent cell is set to VSS. When the writing passes, the channel is set to a boost potential which is the VDD as an initial potential. Therefore, a potential of a floating gate of a memory cell for which writing to an adjacent memory cell passes is increased by capacitive coupling.

Accordingly, at the time when writing to an adjacent memory cell passes, the potential of the floating gate of the adjacent memory cell increases. The potential of the floating gate of the memory cell of interest also increases under influence of capacitive coupling. Therefore, a greater writing voltage than a voltage by which a program voltage is stepped up under control of a control gate is supplied. As a result, the memory cell of interest causes excessive writing (over-programming).

Hence, there is a demand for a non-volatile semiconductor memory device capable of preventing over-programming when writing is performed on all memory cells selected by one word line.

BRIEF DESCRIPTION OF THE DRAWINGS

FIG. 1 represents the first embodiment, i.e., a configuration diagram representing an example of a non-volatile semiconductor memory device;

FIG. 2 is a circuit diagram corresponding to a part of FIG. 1;

FIG. 4 is a flowchart representing an operation of the first embodiment;

FIG. 6 is a flowchart representing an operation of the second embodiment;

FIG. 9 is a timing chart representing an operation of the third embodiment.

DETAILED DESCRIPTION

Figure 3A:
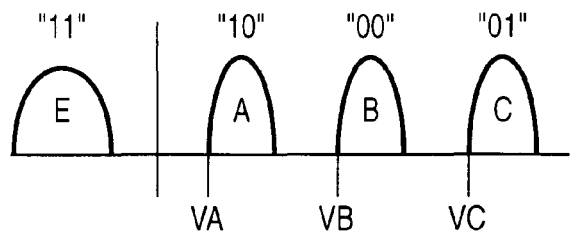
FIGS. 3A, 3B, and 3C are a graph representing write data and threshold voltage distributions.

In general, according to one embodiment, a semiconductor memory device includes a memory cell array, a data memory circuit, a voltage generation circuit, and a controller. On the memory cell array, plural memory cells in which two-or-more-bit data is stored are arranged in a matrix. The plural memory cells are connected to plural bit lines and plural word lines. The data memory circuit is connected to each of the plural bit lines and stores data to be written to the memory cells. The voltage generation circuit generates a write voltage and a step-up voltage which steps up the write voltage. When data is written to all the memory cells connected to selected word lines, the controller performs a write operation with a write voltage obtained by adding the step-up voltage to the write voltage until a number of times by which the write operation is repeatedly performed reaches a first write count. If the first write count is exceeded, whether the step-up voltage is to be added or not is then controlled for each execution of the write operation.

Hereinafter, embodiments will be described with reference to the drawings.

(First Embodiment)

FIG. 1 illustrates a configuration of a NAND flash memory capable of storing, for example, two-bit data of four values in memory cells.

A memory cell array 1 includes plural bit lines, plural word lines, and a common source line. For example, memory cells constituted by EEPROM cells, in which data can be electrically rewritten, are arrayed in a matrix. The memory cell array 1 is connected to a bit-line control circuit 2 and a word-line control circuit 6.

The bit-line control circuit 2 reads data through the bit lines from memory cells in the memory cell array 1, and detects states of the memory cells in the memory cell array 1 through the bit lines. The bit-line control circuit 2 also applies a write control voltage to the memory cells in the memory cell array 1 to perform writing to the memory cells. The bit-line control circuit 2 is connected to a column decoder 3 and a data input/output buffer 4. The bit-line control circuit 2 includes plural data memory circuits described later, which are selected by a column decoder 3. Data read from the memory cells to the data memory circuit is output externally from a data input/output terminal 5 through the data input/output buffer 4.

The data input/output terminal 5 is connected to, for example, an unillustrated controller. The controller outputs various commands CMD for controlling operations of the NAND flash memory, addresses ADD, and data DT. The data input/output terminal 5 receives the commands CMD, addresses ADD, and data DT output from the controller. Write data input to the data input/output terminal 5 is supplied through the data input/output buffer 4 to the data memory circuit by the column decoder 3, and commands and addresses are supplied to the controller 7.

The controller 7 is connected to a control signal input terminal 8. The control signal input terminal 8 receives control signals output from the controller, such as control signals/CE (chip enable), ALE (address latch enable), CLE (command latch enable), /WE (write enable), and/RE (read enable).

The controller 7 controls operations of the NAND flash memory in accordance with various control signals supplied from the control-signal input terminal 8, and commands and addresses supplied from the data input/output buffer 4.

The voltage generation circuit 9 is connected to the controller 7. The voltage generation circuit 9 includes, for example, an unillustrated pump circuit, and generates a program voltage VPGM as a high voltage for writing, an intermediate voltage supplied to non-selected word lines for writing, a step-up voltage which slightly increases the program voltage VPGM, a verify voltage, a read voltage, and an erase voltage. The voltages generated by the voltage generation circuit 9 are supplied to the memory cell array 1, word-line control circuit 6, bit-line control circuit 2, and column decoder 3.

The word-line control circuit 6 is connected to the memory cell array 1. The word-line control circuit 6 selects word lines in the memory cell array 1, and applies a voltage required for reading, writing, or erasure, to the selected word lines.

The bit-line control circuit 2, column decoder 3, word-line control circuit 6, controller 7, and voltage generation circuit 9 constitute a write circuit and a read circuit.

FIG. 2 represents an example of a configuration of a memory cell array 1 and a bit-line control circuit 2. Plural NAND strings are arranged on the memory cell array 1. Each NAND string is constituted by memory cells MC constituted by, for example, 64 EEPROMs which are connected in series, and selector gates S1 and S2. Selector gate S2 is connected to a bit line BL0, and selector gate S1 is connected to a source line SRC. Control gates of the memory cells MC arranged in each row are connected in common to corresponding one of word lines WL0 to WL63. Also, selector gates S2 are connected in common to a selector line SGD, and selector gates S1 are connected in common to a selector line SGS.

The bit-line control circuit 2 includes plural data memory circuits 10. The data memory circuit 10 are respectively connected to corresponding bit lines BL0, BL1, BL2, BL3, ..., BLi, BLi+1, ..., BLn−1, and BLn.

In a write operation (also referred to as a program operation), a program verify operation, and a read operation, bit lines BL0, BL1, BL2, BL3, ..., BLi, BLi+1, ..., BLn−1, and BLn connected to the data memory circuits 10 are selected in accordance with address signals YA0, YA1, ..., YAi, ..., and YAn. Depending on each address signal, one word line is selected, and two pages denoted by a broken line are selected. The two pages are switched from each other by addresses.

Each of the data memory circuits 10 includes, for example, a sense amplifier S/A, three data latch circuits DLT, and a data controller DCNT. For example, the data latch circuits DLT constitute part of a page buffer, and the data controller DCNT operates data in the data latch circuits DLT and data read from memory cells. Each data latch circuit DLT latches 1-bit data.

When writing data, the data memory circuits 10 latch write data supplied from outside to the data latch circuits DLT. Further, the data memory circuits 10 operate the write data latched in the data latch circuits DLT, by the data controller DCNT, and thereby generate data to be written to memory cells.

For write verification, the data memory circuits 10 latch data read from memory cells to the data latch circuits DLT. If writing is incomplete, latched data is operated by the data controller DCNT, for example, to reproduce write data. If the verification passes and if writing is complete, for example, data "1" is set in a predetermined data latch circuit DLT. For write verification of the second page, data "11" is set in two data latch circuits DLT.

Further, when reading data, data read from memory cells is latched in the data latch circuits DLT by the sense amplifier S/A. The latched data is output to outside.

In the configuration described above, the write, read, and erase operations are performed by inputting the commands CMD, addresses ADD, and data DT from outside.

FIG. 3 represent relationships between two-bit write data of four values and threshold voltage distributions. When writing data, data for the first page (lower page) is written first, and then, data for the second page (upper page) is written. A two-valued threshold voltage distribution is set by writing the first page, and a four-valued threshold voltage distribution is set by writing the second page.

Figure 3B:
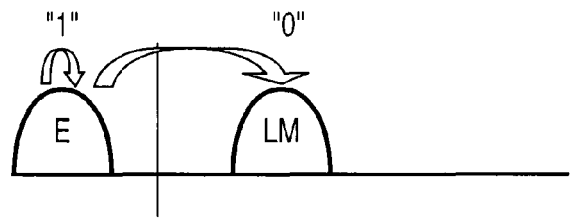

That is, as in FIG. 3A, a threshold voltage distribution of memory cells is represented at "E" in an erasing state. As represented in FIG. 3B, if write data is "1" in a write operation for the first page, the threshold voltage distribution of memory cells is set to, for example, "LM".

Figure 3C:
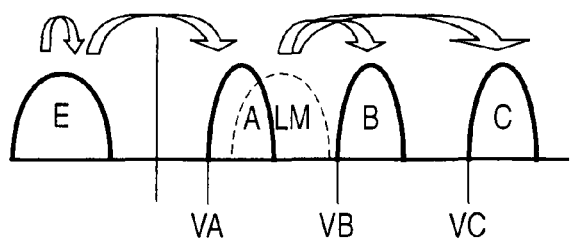

Thereafter, a write operation for the second page is performed as represented in FIG. 3C. The write operation for the second page is performed as follows by using write data for the first and second pages. If write data for the first page is "1" and if write data for the second page is "1", the threshold voltage distribution stays as represented at "E". If write data for the first page is "1" and if write data for the second page is "0", the threshold voltage distribution is as represented at "A". If write data for the first page is "0" and if write data for the second page is "0", the threshold voltage distribution is as represented at "B". Further, if write data for the first page is "0" and if write data for the second page is "1", the threshold voltage distribution is as represented at "C".

In write-verification of the second page, threshold voltages written in memory cells are verified by using verify voltages VA, VB, and VC. The verify voltages VA, VB, and VC are set to be slightly higher than read voltages for the threshold voltages.

(Write Operation)

Next, a write operation for the second page according to the first embodiment will be described with reference to FIGS. 4 and 5.

An address for writing is input externally, and information of the address is latched by the data input/output buffer 4. Based on the information, a row address is selected, and a block and a page to write in are selected. Thereafter, a write start command is input, and writing is performed.

Data for the second page is externally loaded into one of the data latch circuits DLT, and a write sequence for the second page is started. Also in the write sequence for the second page, data for the first page is read, and the data is transferred to other one of the data latch circuits DLT. Subsequently, the data latched in the two data latch circuits DLT is operated by the data controller DCNT, and write data for two-bit data is set. Specifically, corresponding to threshold voltage distributions "E", "A", "B", and "C", respectively, "1", "1", "0", and "0" as write data are latched by the (first) one of the data latch circuit DLT (XDL), and "1", "0", "0", and "1" as write data are latched by the other (second) one of the data latch circuits DLT (LDL) (S10).

Next, the voltage generation circuit 9 is started up, and a high voltage VPGM required for a write operation and an intermediate voltage are generated (S11).

Thereafter, all memory cells connected to selected word lines for rows and columns are respectively written simultaneously by the word-line control circuits 6 and bit-line control circuits 2 (S12). Since both writing and non-writing are simultaneously performed by writing to the memory cells, a self-boost operation described above is carried out. That is, when data is written to memory cells, the ground potential VSS is supplied to the bit lines. For memory cells to be subjected to non-writing, an internal power supply voltage VDD is supplied to the bit lines. Thereafter, a voltage of a selector gate line SGD for selector gates S2 is decreased to be lower than the internal power supply voltage VDD.

Thereafter, a high write voltage (program voltage) VPGM is supplied to selected word lines. An intermediate write voltage VPASS is supplied to non-selected word lines. VSS is transferred to channels of memory cells to be written. In this manner, a FN tunnel current is generated, and electrons are injected into floating gates, thereby to perform writing. An internal power supply voltage VDD is transferred, as an initial charge, to channels of non-writing memory cells. Thereafter, SGD is decreased, thereby putting inside of the NAND memory cells in a floating state. In this state, the high write voltage and the intermediate write voltage are respectively supplied to selected and non-selected word lines. Potentials of the channels are increased by coupling, and non-writing is thereby achieved.

As a writing method to increase non-writing efficiency, a local self boost (Local Self Boost: LSB) method is applicable. The LSB method is to cut off adjacent memory cells in two sides of a selected memory cell, and to boost channels and diffusion layers of selected memory cells by electrically separating and floating the channels and diffusion layers from the other memory cells.

Whether all data has been written or not is determined after the write operation described above (S13). The determination is made in a manner as follows, for example. If verification passes in a verify operation, DLT (XDL)="1" and DLT (LDL)="1" are written to two data latch circuits DLT in which write data is stored. Therefore, whether writing is complete or not can be determined by determining whether or not data "11" has been set in a predetermined data latch circuits DLT in all data memory circuits 2.

If writing is incomplete as a result of the determination in step S13, a write verify operation is performed (S14). The verify operation is performed for each write level. Specifically, at first, a verify operation "A" which has the lowest threshold voltage distribution is performed. That is, a verify voltage VA is supplied to selected word lines, and data is read from memory cells. As a result of the reading, whether a threshold voltage reaches the verify voltage VA or not is determined. In an initial stage of the write operation, memory cells corresponding to threshold voltage distribution "B" or "C" are not yet sufficiently written. Therefore, verify operations (S15 and S16) using verify voltages VB and VC are skipped, as represented in FIG. 5.

Also, if a threshold voltage of memory cells reach a verify voltage as a result of the verification described above, data "1" indicating that the verification passes is set in a predetermined data latch circuit DLT in a corresponding data memory circuit 2.

After the verify operation described above, whether a number of times by which each data has been written is within a range of a predefined write loop count (a defined loop count) or not is determined. Here, the defined loop count is, for example, a loop count (LP_S) of start and is also a loop count of end (LP_E). These loop counts are predetermined parameters for each chip and for each write data item, i.e., variable values. Specifically, a loop count of start (LP_$S_A$) and a loop count of end (LP_$E_A$) are set for a threshold voltage distribution "A", and a loop count of start (LP_$S_B$) and a loop count of end (LP_$E_B$) are set for a threshold voltage distribution "B". Further, a loop count of start (LP_$S_C$) and a loop count of end (LP_$E_C$) are set for a threshold voltage distribution "C".

In step S17, whether the write loop count LP_N is within ranges of the loop count of start and the loop count of end corresponding to each of threshold voltage distributions "A", "B", and "C". That is, a next determination is performed.

LP_$S_A$<LP_N<LP_$E_A$

LP_$S_B$<LP_N<LP_$E_B$

LP_$S_C$<LP_N<LP_$E_C$

Figure 5:
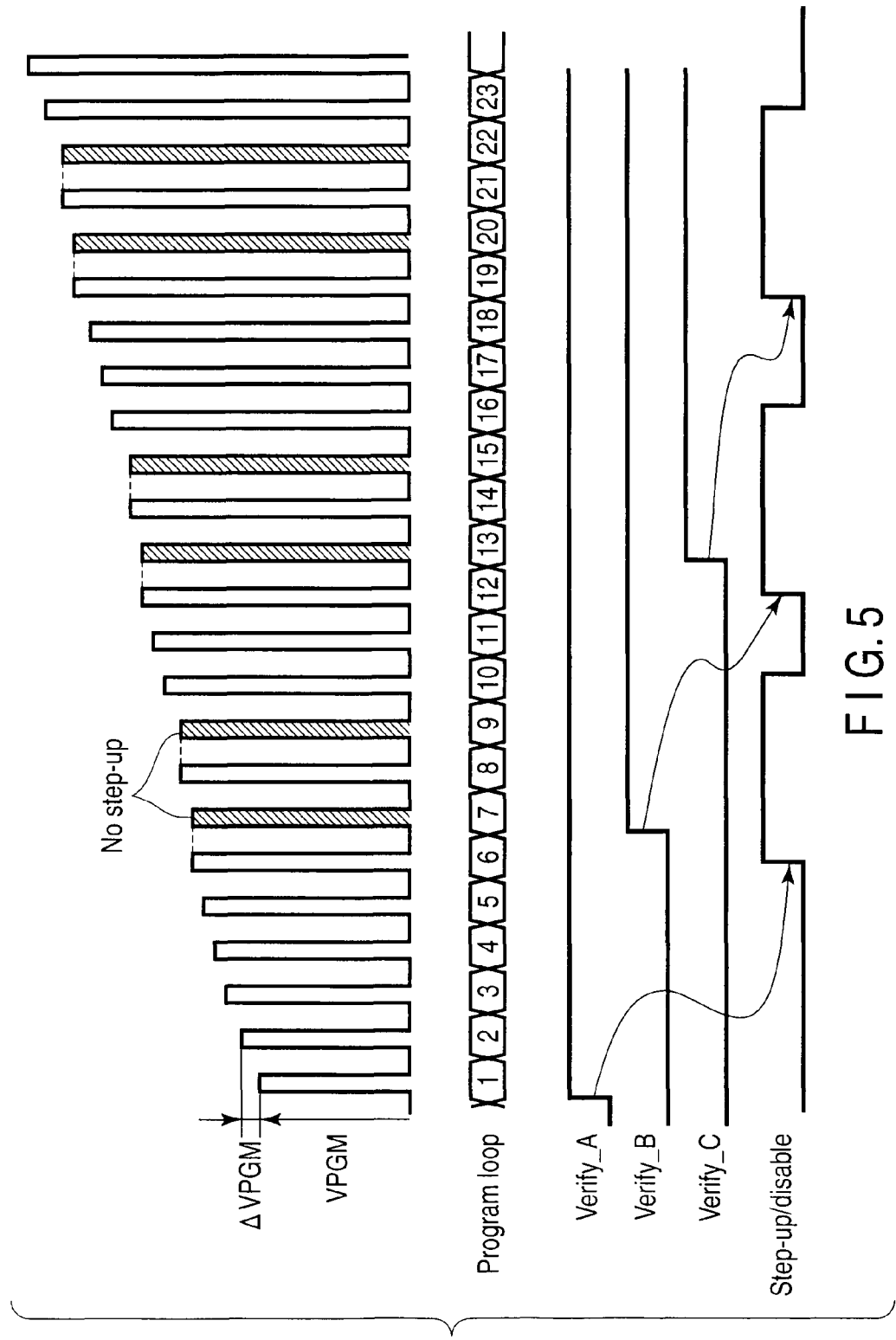
FIG. 5 is a timing chart representing an operation of the first embodiment.

As a result of determination described above, if the write loop count LP_N reaches none of the defined loop counts LP_$S_A$, LP_$S_B$, and LP_$S_C$, the write voltage VPGM is stepped up by ΔVPGM, as represented in FIG. 5 (S18), and a program operation is performed again (S12).

As a result of determination of step S17, if the write loop count LP_N is within a range of the defined loop count expressed by the expression described above, whether the write loop count LP_N is 2n or not (where n is a natural integer not smaller than 1) (S19). As a result, if the write loop count LP_N is 2n, the write voltage VPGM is not stepped up but the program operation is performed (S12). If the write loop count LP_N is not 2n, the write voltage VPGM is stepped up in the step 18, and then the program operation is performed (S12). That is, if the write loop count LP_N is within a range of the defined loop count, the program operation is performed while stepping up the write voltage VPGM once for each write operation.

FIG. 5 represents an example in which, for example, the loop count of start is set to 6 and the loop count of end is set to 10. When the loop count is 6 to 10 in write and verify operations of a threshold voltage distribution "A", ΔVPGM is added to the program voltage VPGM once for each two loop counts. That is, the write operation for the seventh time is performed with the same program voltage as the sixth program voltage. In this manner, even when a voltage of a floating gate of an adjacent cell in the write operation increases from that for the seventh time, a voltage of a floating gate of a written memory cell is prevented from increasing.

In a manner as described above, write and verify operations are repeated, and the loop count $LP\_E_A$ of end reaches 10, for example. Then, step S17 is transited to step S18. In step S18, the program voltage VPGM is increased by the step-up voltage ΔVPGM, and the program is performed again (S12).

In FIG. 5, the defined loop counts for threshold voltage distributions "A", "B", and "C" are respectively represented as values from the verify start counts in threshold voltage distributions "A", "B", and "C".

Verification of threshold voltage distribution "B" is started from a preset write loop count of 6. Verification of threshold voltage distribution "C" is started from a preset write loop count of 13. Verify start loop counts for threshold voltage distributions "B" and "C" are variable values which can be predetermined in accordance with test results of chips.

For threshold voltage distributions "B" and "C" as well, ΔVPGM is added to a program voltage VPGM once for each two loop counts through step S19, within a range of the predefined write loop count in step S17.

The write and verify operations described above are repeated. If all writing is complete as a result of the determination in step S13, a recovery operation (S20) is performed, and thereafter, a write sequence is finished. In the recovery operation, for example, a high-voltage pump circuit in the voltage generation circuit 9 is reset.

In the first embodiment, regarding each of threshold voltage distributions "A", "B", and "C", if the write/verify loop count is 6 to 10, an operation of stepping up a program voltage is switched to be alternately valid and invalid for each step up. Therefore, for example, a write operation for the seventh time is performed at the same voltage as a program voltage for the sixth program voltage. In this manner, in the seventh write operation, a voltage of a floating gate of a cell of interest can be restricted from increasing due to an increase of the potential of a floating gate of an adjacent cell. Accordingly, excessive writing can be prevented.

The defined loop counts are set at loop counts at which writing is performed into threshold voltage distributions "A", "B", and "C". For example, for threshold voltage distribution "A", a loop count 6 to 10 is set at which write verification is considered to pass for most memory cells if write loops are required twelve times until all writing for threshold voltage distribution "A" is complete in consideration of variants in writing. Further, in four write loops from the sixth to ninth times, a step-up operation for the program voltage VPGM is switched to be alternately valid and invalid.

The defined loop counts for threshold voltage distributions "A", "B", and "C" are not limited to the foregoing examples but may be respectively set for threshold voltage distributions "A", "B", and "C".

According to the first embodiment described above, the program voltage is stepped up once for each two loop counts, in the last half of write loop counts for each of threshold voltage distributions "A", "B", and "C" corresponding to write data in a write sequence which employs the write method of stepping up the program voltage. Therefore, even when writing to adjacent memory cells passes and potentials of floating gates thereof increase, a potential of a floating gate of a cell of interest can be restricted from increasing due to capacitive coupling with the floating gates of the adjacent memory cells. Accordingly, excessive writing to a cell of interest can be suppressed. Particularly if writing to the cells in two sides is completed sooner than writing to the cell of interest when the same data as the cell of interest is written to cells in two sides of the cell of interest, the potential of the floating gate of the cell of interest greatly changes. However, excessive writing to a cell of interest can be suppressed by stepping up the program voltage once for each two loop counts.

(Second Embodiment)

Figure 7:
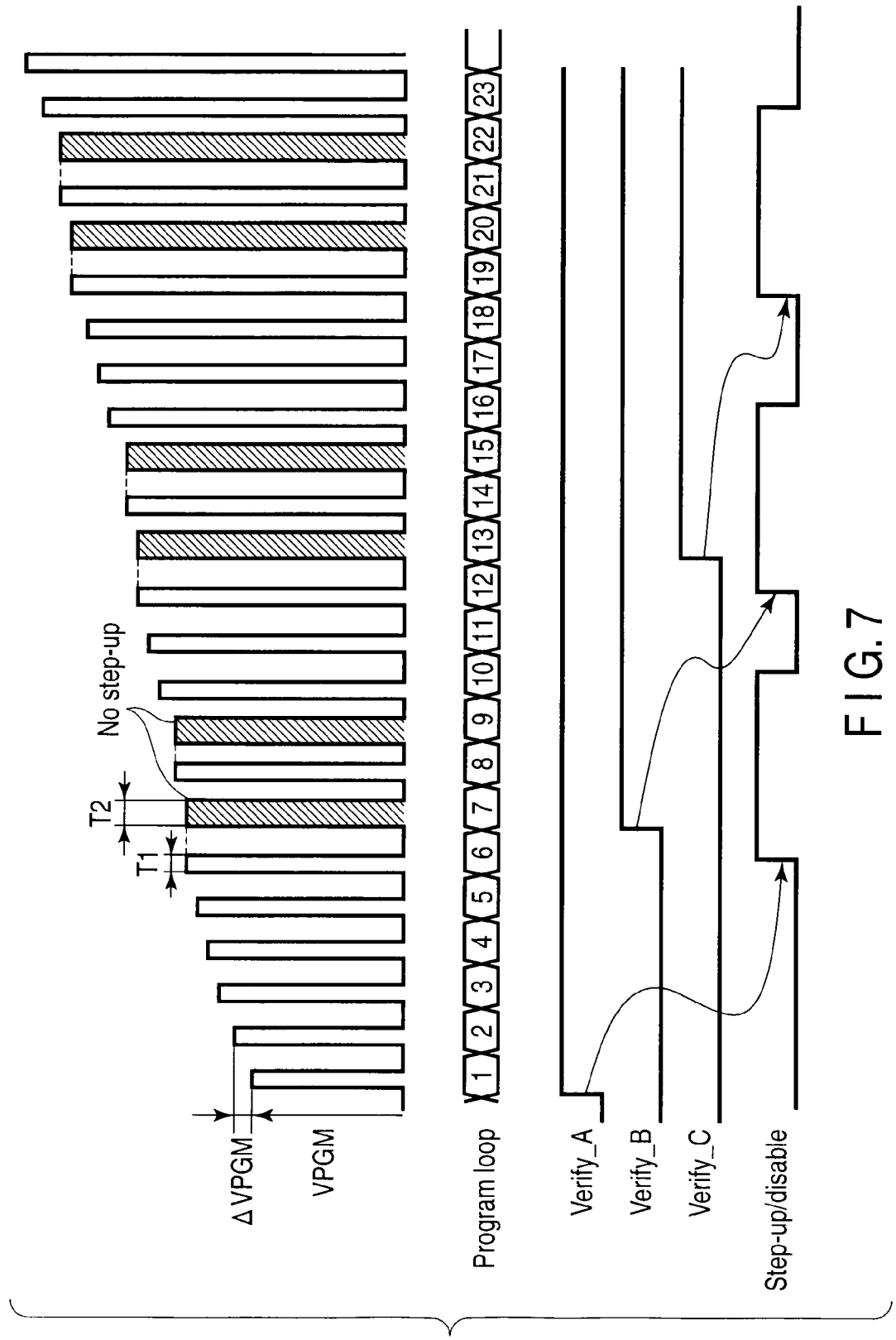
FIG. 7 is a timing chart representing an operation of the second embodiment.

FIGS. 6 and 7 represent the second embodiment. The same parts as in FIGS. 4 and 5 are denoted at the same reference symbols, and only different parts will be described.

The second embodiment differs from the first embodiment in a program operation when a program voltage VPGM is not stepped up. In both cases that the program voltage VPGM is stepped up and is not stepped up in the first embodiment, the program time stays the same. When the program voltage VPGM is not stepped up, cells which are less influenced by potentials of floating gates of adjacent cells cause less increase of threshold voltages, and accordingly increase a total writing time.

Hence, in the second embodiment, the program time is changed between the case of stepping up the program voltage VPGM and not stepping up the program voltage. That is, when the program voltage VPGM is stepped up, a write operation is performed with a program time T1 as in FIG. 7, in step S12 represented in FIG. 6 as in the first embodiment.

In contrast, when the program voltage VPGM is not stepped up, a control is transited from step S20 to step S21. As represented in FIG. 7, the write operation is performed with a program time T2. Program time T2 is set to be longer than program time T1. Therefore, for cells which are greatly influenced by potentials of floating gates of adjacent cells, the program voltage VPGM is not stepped up. Accordingly, even when the program time is increased, great increase of threshold voltages can be suppressed, and excessive writing can be suppressed. Cells which are less influenced by potentials of floating gates of adjacent cells are programmed with longer program time T2 than program time T1. Therefore, threshold voltages can be increased.

According to the second embodiment, program time T2 when the program voltage VPGM is not stepped up is set to be longer than program time T1 when the program voltage VPGM is stepped up. Therefore, a writing time for cells which are greatly influenced by potentials of floating gates of adjacent cells can be shortened. Accordingly, a total writing time can be shortened.

(Third Embodiment)

Figure 8:
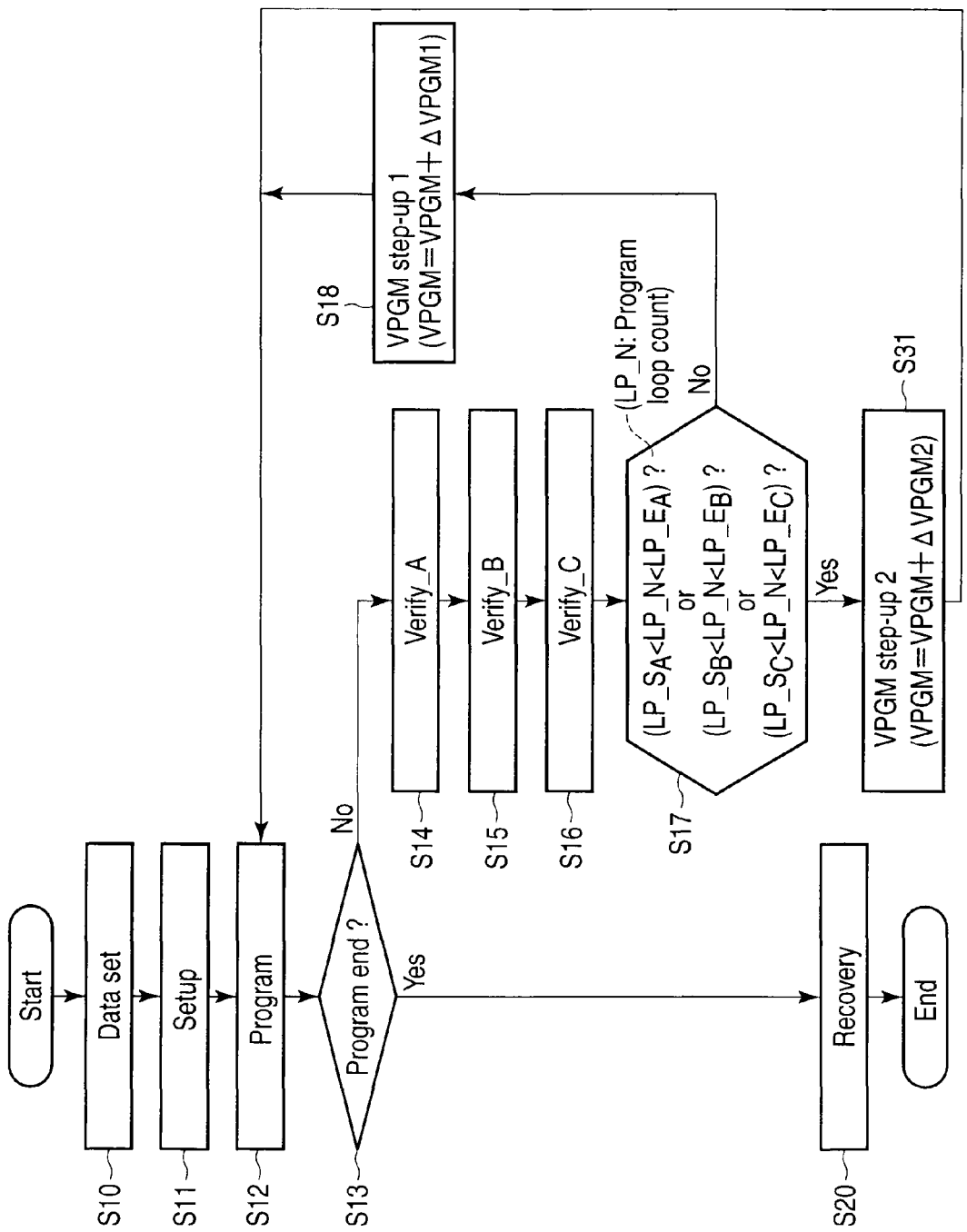
FIG. 8 is a flowchart representing an operation of the third embodiment.

FIGS. 8 and 9 represent the third embodiment. The same parts as in the first and second embodiments are denoted at the same reference symbols, and only different parts will be described.

In the first embodiment, when a write loop count is within a range of a defined loop count, a program voltage VPGM is stepped up by a constant step-up voltage ΔVPGM once for each two loop counts. The step-up voltage ΔVPGM is equal to a step-up voltage ΔVPGM before the loop count reaches a loop count of start.

In contrast, in the third embodiment, a step-up of VPGM is not performed once per two times and a step-up voltage is set to ΔVPGM2 when a loop count is within a range of a defined loop count, with respect to a step-up voltage ΔVPGM1 before the loop count reaches the defined loop count. The ΔVPGM2 is a voltage lower than the ΔVPGM1, As represented in FIG. 9.

Specifically, if a write loop count LP_N reaches none of loop counts LP_$S_A$, LP_$S_B$, and LP_$S_C$ as a determination of step S17 represented in FIG. 8, the program voltage VPGM is increased by the step-up voltage ΔVPGM1 in step S18. The program is performed again with the increased program voltage VPGM (S12).

Otherwise, as a result of step S17, if the write loop count LP_N is within a range of the defined loop count, the program voltage VPGM is increased by ΔVPGM2 in step S31. That is, when a loop count of start (LP_s) reaches, for example, six, the program voltage VPGM is increased by the step-up voltage ΔVPGM2. The program is performed again with the increased program voltage VPGM (S12).

This operation is repeated as represented in FIG. 9, and a loop count of end LP_$E_A$ reaches, for example, ten, step S17 transits to step S18. In step S18, the program voltage VPGM is increased by the step-up voltage ΔVPGM1, and the program is performed again (S12).

Also for threshold voltage distributions "B" and "C", ΔVPGM2 is added to the program voltage VPGM through step S31 within a range of the predefined write loop count in step S17.

According to the third embodiment, the step-up voltage ΔVPGM2 to be added to the program voltage is set to be lower than the normal step-up voltage ΔVPGM1, within a defined loop range. Therefore, a potential of a floating gate of a cell of interest can be restricted from changing due to potentials of floating gates of memory cells which have become unwritten. Accordingly, excessive writing to the cell of interest can be suppressed.

The step-up voltage ΔVPGM2 is not limited to one. For example, plural different step-up voltages ΔVPGM2 which are lower than ΔVPGM1 may be prepared, and a selection may be made from the plural step-up voltages.

The first to third embodiments have been described where two-bit data of four values is stored in each of memory cells. However, the embodiments are not limited to this case but the embodiments are applicable where 3-or-more-bit data is stored.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array in which a plurality of memory cells for storing two-or-more-bit data are arranged in a matrix, the plurality of memory cells being connected to a plurality of bit lines and a plurality of word lines;
a data memory circuit which is connected to each of the plurality of bit lines and stores data to write to the plurality of memory cells;
a voltage generation circuit which generates a write voltage and a step-up voltage to step up the write voltage; and
a controller, wherein
when data is written to all memory cells connected to selected word lines, the controller performs a write operation with a write voltage obtained by adding the step-up voltage to the write voltage until a write count indicating a number of times by which writing is performed reaches a first write count, and when the first write count is exceeded, the controller controls whether the step-up voltage is to be added or not, for each write operation, and the controller performs a verify operation whether the step-up voltage is added to the write voltage or not.

2. The device according to claim 1, wherein
When the first write count is exceeded, the controller controls whether the step-up voltage is to be added or not, for each write operation, until a second write count is reached, the second write count is greater than the first write count.

3. The device according to claim 2, wherein
the memory cells store not less than a four values, and between the first write count and the second write count, at least the verify operation of one value among the four values is performed.

4. The device according to claim 3, wherein between a third write count and a fourth write count which is greater than the second write count, the controller performs a verify operation whether the step-up voltage is added to the write voltage or not.

5. The device according to claim 2, wherein
when the second write count is exceeded, the controller adds the step-up voltage to the write voltage.

6. The device according to claim 1, wherein
the controller adds the step-up voltage to the write voltage once each time when the write operation is performed 2n times where n is an integer not smaller than 1.

7. A semiconductor memory device comprising:
a memory cell array in which a plurality of memory cells for storing two-or-more-bit data are arranged in a matrix, the plurality of memory cells being connected to a plurality of bit lines and a plurality of word lines;
a data memory circuit which is connected to each of the plurality of bit lines and stores data to write to the plurality of memory cells;
a voltage generation circuit which generates a write voltage and a step-up voltage to step up the write voltage; and
a controller, wherein
when data is written to all memory cells connected to selected word lines, the controller performs a write operation with a write voltage obtained by adding the step-up voltage to the write voltage until a write count indicating a number of times by which writing is performed reaches a first write count, and when the first write count is exceeded, the controller controls whether the step-up voltage is to be added or not, for each write operation, and
the controller applies the write voltage to memory cells for a first time period, and applies the write voltage to memory cells for a second time period when the step-up voltage is not added to the write voltage, the second time period being longer than the first time period, and the controller performs a verify operation whether the step-up voltage is added to the write voltage or not.

8. The device according to claim 7, wherein
the controller adds the step-up voltage to the write voltage once each time when the write operation is performed 2n times where n is an integer not smaller than 1.

9. The device according to claim 7, wherein
when the first write count is exceeded, the controller controls whether the step-up voltage is to be added or not, for each write operation, until a second write count is reached, the second write count is greater than the first write count.

10. The device according to claim 9, wherein
the memory cells store not less than a four values, and between the first write count and the second write count, at least the verify operation of one value among the four values is performed.

11. The device according to claim 9, wherein
when the second write count is exceeded, the controller adds the step-up voltage to the write voltage.

12. The device according to claim 11, wherein
between a third write count and a fourth write count which is greater than the second write count, the controller performs a verify operation whether the step-up voltage is added to the write voltage or not.

13. The device according to claim 12, wherein
between the third write count and the fourth write count, the controller applies the write voltage to memory cells for a first time period, and applies the write voltage to memory cells for a second time period when the step-up voltage is not added to the write voltage, and the controller performs a verify operation whether the step-up voltage is added to the write voltage or not.

14. A semiconductor memory device comprising:
a memory cell array in which a plurality of memory cells for storing two-or-more-bit data are arranged in a matrix, the plurality of memory cells being connected to a plurality of bit lines and a plurality of word lines;
a data memory circuit which is connected to each of the plurality of bit lines and stores data to write to the plurality of memory cells;
a voltage generation circuit which generates a write voltage and a first step-up voltage to step up the write voltage and a second step-up voltage to step up a second step-up voltage different from the first step-up voltage; and
a controller, wherein
when data is written to all memory cells connected to selected word lines, the controller performs a write operation with a write voltage obtained by adding the first step-up voltage to the write voltage until a write count indicating a number of times by which writing is performed reaches a first write count, and when the first write count is exceeded, the controller adds the second step-up voltage to the first step-up voltage for each write operation, and the controller performs a verify operation whether the step-up voltage is added to the write voltage or not.

15. The device according to claim 14, wherein the second step-up voltage is lower than the first step-up voltage.

16. The device according to claim 14, wherein
when the first write count is exceeded, the controller adds the second step-up voltage, until a second write count is reached, the second write count is greater than the first write count.

17. The device according to claim 16, wherein
the memory cells store not less than a four values, and between the first write count and the second write count, at least the verify operation of one value among the four values is performed.

18. The device according to claim 17, wherein
when the second write count is exceeded, the controller adds the first step-up voltage to the write voltage.

19. The device according to claim 18, wherein
between a third write count and a fourth write count which is greater than the second write, the controller adds the second step-up voltage to the write voltage.

* * * * *